US006781375B2

(12) United States Patent
Miyazaki et al.

(10) Patent No.: US 6,781,375 B2
(45) Date of Patent: Aug. 24, 2004

(54) MAGNETIC RESONANCE IMAGING USING PREPARATION SCAN FOR OPTIMIZING PULSE SEQUENCE

(75) Inventors: Mitsue Miyazaki, Otawara (JP); Hiroshi Takai, Nasu-Gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/218,904

(22) Filed: Aug. 15, 2002

(65) Prior Publication Data

US 2003/0042905 A1 Mar. 6, 2003

(30) Foreign Application Priority Data

Aug. 31, 2001 (JP) ........................................ 2001-264721

(51) Int. Cl.$^7$ ................................................ G01V 3/00
(52) U.S. Cl. ......................................... 324/314; 324/306
(58) Field of Search ................................ 324/314, 306, 324/307, 309, 300, 318, 322

(56) References Cited

U.S. PATENT DOCUMENTS

| | | | |
|---|---|---|---|
| 4,609,872 A | | 9/1986 | O'Donnell |
| 5,320,099 A | | 6/1994 | Roberts et al. |
| 5,417,214 A | | 5/1995 | Roberts et al. |
| 5,565,777 A | | 10/1996 | Kanayama et al. |
| 5,584,293 A | * | 12/1996 | Darrow et al. ............... 600/410 |
| 5,830,143 A | | 11/1998 | Mistretta et al. |
| 6,043,655 A | | 3/2000 | Makita et al. |
| 6,275,035 B1 | * | 8/2001 | Debbins et al. ............... 324/307 |
| 6,320,377 B1 | | 11/2001 | Miyazaki et al. |
| 6,362,620 B1 | * | 3/2002 | Debbins et al. ............... 324/309 |

FOREIGN PATENT DOCUMENTS

| | | |
|---|---|---|
| JP | 2-43494 | 9/1990 |
| JP | 3-53936 | 8/1991 |
| JP | 11-239571 | 9/1999 |
| JP | 2000-300538 | 10/2000 |

OTHER PUBLICATIONS

Chung et al, "Inversion Recovery Cine TruFISP for Optimizing TI in Myocardial Infarct Imaging", Proc. Soc. Mag. Reson, Med. 10 (2002).
Miyazaki, U.S. patent appln. No. 09/773,380, filed Feb. 1, 2001, MR Imaging Using ECG–Prep Scan.
Prince, "Gadolinium–Enhanced MR Aortography", Radiography 1994, 191; 155–164.
Kim et al, "3–D MR Angiography with Scanning 2–D Images—Simultaneous Data Acquisition of Arteries and Veins (SAAV)", Magnetic Resonance in Medicine 14, 554–561 (1990).
Miyazaki et al, "Non–Contrast–Enhanced MR Angiography Using 3D ECG–Synchronized Half–Fourier Fast Spin Echo", Journal of Magnetic Resonance Imaging 12:776–783 (2000).

\* cited by examiner

Primary Examiner—Louis Arana
(74) Attorney, Agent, or Firm—Nixon & Vanderhye P.C.

(57) ABSTRACT

To optimize in advance a desired image quality determining pulse sequence parameter incorporated in an imaging scan, a preparation scan is adopted. The preparation scan is performed with the amount of at least one desired image quality parameter changed for each of plural preparatory images, so that a plurality of preparatory images at the desired same region of the object are acquired. For example, one such image quality parameter is TI (inversion time). The acquired preparatory scan data are processed into a plurality of preparatory images for display. A desired preparatory image is then selected from the plural preparatory images displayed, and the amount of the desired parameter used for that selected preparatory image is then set for use in the pulse sequence for a complete diagnostic imaging scan. Hence the desired image quality determining parameter of the pulse sequence is caused to have an optimum value before an actual complete diagnostic imaging scan.

16 Claims, 13 Drawing Sheets

MAGNETIC RESONANCE IMAGING USING PREPARATION SCAN FOR OPTIMIZING PULSE SEQUENCE

BACKGROUND OF THE INVENTION

1. Technical Field of the Invention

The present invention relates to magnetic resonance imaging including non-contrast angiography, that uses a preparation scan to optimize a desired pulse sequence image quality parameter incorporated in an imaging scan in order to provide improved quality MR images.

2. Related Art

Magnetic resonance imaging (MRI) is a technique of applying a radio-frequency (RF) signal at a Larmor frequency to an object so that nuclear spins positioned in a static magnetic field are magnetically excited and then reconstructing an image from MR signals induced in response to the excitation.

However, it is not always true that an MR imaging scan is performed under the best imaging conditions. That is, an imaging scan is frequently performed under an unfavorable condition where one or more pulse sequence parameters of the imaging scan, which can significantly influence MR image of quality, has not been optimized.

One of the imaging techniques that has recently been highlighted is, for example, non-contrast MR angiography. This imaging technique provides images of blood vessels and/or flows of blood within an object, with no contrast agent administered into the object. In performing non-contrast MR angiography, a three-dimensional imaging scan is preferable when it is desired to obtain more angiographic information.

Such non-contrast MR angiography typically includes, for example, a dephase pulse to suppress a flow void phenomenon. When the flow void phenomenon is generated in response to a flow of blood, some drawbacks, such as a decrease in the intensity of an echo signal to be acquired, are caused. It is therefore preferred that the degree of such flow void phenomenon be detected beforehand, and that imaging conditions be determined for every object to be imaged in consideration of the flow void phenomenon.

In cases where non-contrast MR angiography is directed, for example, to the iliac artery, speeds of blood flowing in the iliac artery are not only different depending on individuals but also substantially different between a healthy person and a non-healthy patient. Even if the iliac artery of the same person is being imaged, speeds of blood flows change depending on which region is to be scanned.

However, from a historical viewpoint, optimization of various parameters of an imaging scan pulse sequence for such phenomena, which should be carried out prior to the imaging scan, has not been adequately studied. Hence it has been difficult for an operator to imagine the inside of an object to be examined, and then to recognize the degree of expected flow void with accuracy in a desired readout direction, before carrying out a three-dimensional scan. Instead, operators typically infer the degree of flow void using their own experience or by trial and error and then try to reflect the inferred degree into imaging conditions. A trial scan could be carried out for inferring the degree of flow void, but this trial scan would not be quantitative. Thus the total imaging time necessary for each person to be examined is, thereby a patient throughput being reduced.

In performing non-contrast MR angiography, image quality parameters of an imaging scan pulse sequence typically may include, in addition to one identifying a degree of flow void, an effective echo time $TE_{eff}$, a bit indicating flow compensation, inversion recovery time, echo train spacing (ETS), the flip angle of a fat suppression pulse, an inversion time TI after application of a fat suppression pulse, the flip angle of an MT (magnetization transfer) pulse, and the flip angle of a refocusing pulse.

One conventional scan technique is known by a Japanese Patent Laid-open Publication No. 1999-239571. This reference shows an imaging scan using electrocardiographic (ECG) gating, in which a scan to measure an optimized delay time for ECG gating is proposed. This technique, however, takes only ECG gating timing into account, so that this way of scanning is far from providing other various scan parameters.

SUMMARY OF THE INVENTION

The present invention, which has attempted to break through the foregoing current situations, provides both a magnetic resonance imaging system and a magnetic resonance imaging method for magnetic resonance imaging with our without an MR contrast agent, the system and method being able to give an optimum value to a desired an imaging scan parameter in a steady and reliable manner, before carrying out the imaging scan.

In order to achieve the above object, as one aspect of the present invention, there is provided a magnetic resonance imaging system for performing an imaging scan based on a desired pulse sequence in order to obtain MR images at a desired region of an object to be imaged. The system comprises a preparation scan performing unit configured to perform a preparation scan to acquire data for a plurality of preparatory images at a common volume in the desired region of the object, the preparation scan being performed with an amount of a desired image quality (e.g., contrast-determining) parameter of the pulse sequence being changed for each of plural preparatory images; a preparatory image producing unit configured to produce the plurality of preparatory images from the data acquired by the performance of the preparation scan; a displaying unit configured to display the plurality of preparatory images; a selection unit configured to allow a desired preparatory image to be selected from the plurality of preparatory images displayed; and a setting unit configured to set, into the imaging scan, the amount of the desired image quality (e.g., contrast-determining) parameter given from the selected preparatory image.

Accordingly, the magnetic resonance imaging system employs the technique of performing the preparation scan to determine an optimum amount of one or more parameters chosen from the image-quality parameters of the imaging scan. Echo data into which changed amounts of the desired parameters are reflected are acquired by the preparation scan, and images produced from the acquired echo data provide an operator with an optimum amount of the desired parameters in the actual imaging scan. This way enables both of MR imaging and MR angiography (with or without an MR contrast agent) to provide images with excellent contrast, less noise, and higher quality depictions.

Preferably, the preparation scan performing unit is configured to perform the preparatory scan with a series of acquisitions. In the preparatory scan the image matrix size is smaller than that of an MR image acquired through the imaging scan. Still more preferably, the preparation scan is set to a two-dimensional scan and the imaging scan is set to a three-dimensional scan.

It is preferred that the preparation scan performing unit is configured to perform the preparation scan prior to the performance of the imaging scan.

It is also preferred that the system further comprises a breath-hold instructing unit configured to instruct the object to continue holding breath of the object during each period of both of the preparation scan and the imaging scan.

By way of example, the pulse sequence is made of a train of pulses belonging to SSFP (Steady State Free Precession)-system pulse sequences.

The desired parameter of the pulse sequence is, for example, at least one parameter selected from a group of parameters composed of: a strength of a pulse to suppress a flow void phenomenon of a fluid of the object; an effective echo time $TE_{eff}$ concerning behaviors of spins of the object; a pulse to compensate spin movements due to flow of fluid in the object; a TI (inversion time) of spins observed when an inversion pulse is applied to the object; an ETS (echo train spacing) time given to echo signals acquired from the object; a flip angle of a fat suppression pulse applied to suppress signals from being acquired from fat of the object; a TI (inversion time) time observed when a fat suppression pulse is applied to the object; a strength of an MT (magnetization transfer) to cause an MT effect resultant from behaviors of spins in the object; and an angle of a refocusing pulse to reduce an MT effect in the object.

As another configuration according to the above aspect, a magnetic resonance imaging system is provided particularly to, a desired parameter, a TI (inversion time) time incorporated in the pulse sequence. The TI time is observed when an inversion pulse is applied to the region of the object. Accordingly, through the preparation scan, an optimized period of the TI time, that is, the amount of the desired parameter, is determined and reflected into the pulse sequence used by the imaging scan.

Still, as another example according to the above aspect, a magnetic resonance imaging system is provided for performing a three-dimensional imaging scan based on a desired pulse sequence in order to obtain an MR image at a desired region of an object to be imaged. The system comprises a preparation scan performing unit configured to perform a two-dimensional preparation scan to acquire data for a plurality of preparatory images at the desired region of the object, the preparation scan being performed with an amount of a desired parameter of the pulse sequence changed every preparatory image; a preparatory image producing unit configured to produce the plurality of preparatory images from the data acquired by the performance of the preparation scan; and a setting unit configured to set the amount of the desired parameter of the imaging scan on the basis of the plurality of preparatory images produced.

Furthermore, as another aspect, there is provided a method of optimizing a parameter of a pulse sequence used by an imaging scan in magnetic resonance imaging. The imaging scan is performed to provide an MR image at a desired region of an object to be imaged. The method comprises the steps of: performing a preparation scan to acquire data for a plurality of preparatory images at the desired region of the object, the preparation scan being performed with an amount of a desired parameter of the pulse sequence changed every preparatory image; producing the plurality of preparatory images from the data acquired by the performance of the preparation scan; displaying the plurality of preparatory images; allowing a desired preparatory image to be selected from the plurality of preparatory images displayed; and setting, into the imaging scan, the amount of the desired parameter given from the selected preparatory image.

Like the above, the method can be provided so as to comprising the steps of performing a two-dimensional preparation scan to acquire data for a plurality of preparatory images at the desired region of the object, the preparation scan being performed with an amount of a desired parameter of the pulse sequence changed every preparatory image; producing the plurality of preparatory images from the data acquired by the performance of the preparation scan; and setting the amount of the desired parameter of the imaging scan on the basis of the plurality of preparatory images produced.

DETAILED DESCRIPTION OF THE PREFERRED EMBODIMENTS

Referring to the accompanying drawings, a preferred embodiment of the present invention will now be described.

(First Embodiment)

Referring to FIGS. 1 to 13, a first embodiment of the present invention will now be described.

Figure 1:
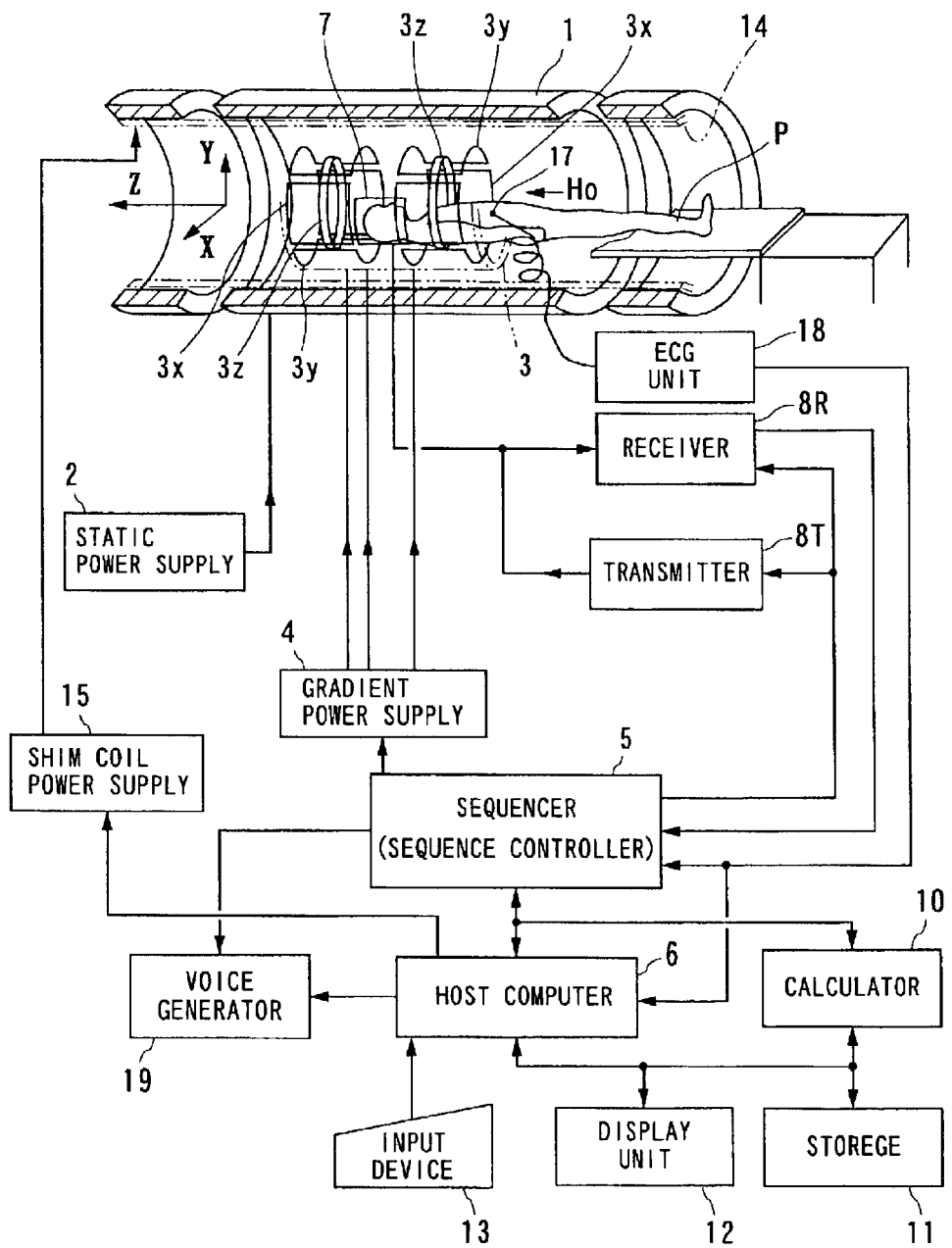
FIG. 1 is the functional block diagram showing an outlined configuration of a magnetic resonance imaging system according to an embodiment of the present invention.

FIG. 1 a shows an outlined configuration of a magnetic resonance imaging (MRI) system in accordance with the embodiment of the present invention.

The magnetic resonance imaging system comprises a patient couch on which a patient P as an object to be imaged lies down, static-field generating part for generating a static magnetic field, magnetic-gradient generating part for appending positional information to a static magnetic field, transmitting/receiving part for transmitting and receiving radio-frequency (RF) signals, controlling/calculating part responsible for the control of the whole system and for image reconstruction, electrocardiographing part for acquiring an ECG signal serving as a signal indicative of cardiac phases of the object P, and breath-hold instructing part for instructing the object to perform a temporary breath hold.

The static-field generating part includes a magnet 1 that is of, for example, a superconducting type, and a static power supply 2 for supplying a current to the magnet 1, and generates a static magnetic field $H_0$ in an axial direction (Z-axis direction) within a cylindrical bore (serving as a diagnostic space) into which the object P is inserted for imaging. The magnet 1 includes shim coils 14. A current used to homogenize a static magnetic field is supplied from a shim coil power supply 15 to the shim coils 14 under the control of a host computer to be described later. The couch top of the patient couch on which the object P lies down can be inserted into the bore of the magnet 1 so that the couch top is withdrawn retractably.

The magnetic-gradient generating part includes a gradient coil unit 3 incorporated in the magnet 1. The gradient coil unit 3 has three pairs (kinds) of x-, y-, and z-coils 3x to 3z used to generate magnetic field gradients that change in strength in the X-axis, Y-axis, and Z-axis directions, that is, the mutually-orthogonal physical-axis directions of the gantry. The magnetic-gradient generating unit further includes a gradient power supply 4 for supplying currents to the x-, y-, and z-coils 3x to 3z. The gradient power supply 4 supplies the x-, y-, and z-coils 3x to 3z with pulsed currents used to generate magnetic gradients, under the control of a sequencer, which will be described later.

The pulsed currents supplied from the gradient power supply 4 to the x-, y-, and z-coils 3x to 3z are controlled, whereby magnetic gradients that can be changed in strength in the three physical-axis directions (that is, the X-, Y-, and Z-directions) are mutually synthesized. This synthesis produces a slice magnetic gradient $G_S$ applied in a slice direction, a phase-encode magnetic gradient $G_E$ applied in a phase-encode direction, and a readout (frequency-encode) magnetic gradient $G_R$ applied in a readout direction, so that the gradients $G_S$, $G_E$ and $G_R$ are selectively specified and arbitrarily changed in strength. The slice, phase-encode, and readout directions are logic-axis directions, which are also orthogonal to each other. The magnetic gradients $G_S$, $G_E$ and $G_R$ generated in the logic-axis directions are superposed on the static magnetic field $H_0$.

The transmitting/receiving part includes a radio-frequency (RF) coil 7 located in the vicinity of the object P in the diagnostic space inside the magnet 1, and a transmitter 8T and a receiver 8R both connected to the coil 7. Both of the transmitter 8T and the receiver 8R operate under the control of a sequencer 5 described later. The transmitter 8T supplies the RF coil 7 with an RF current pulse at a Larmor frequency, which will cause a nuclear magnetic resonance (NMR). The receiver 8R receives MR signals (RF signals) via the RF coil 7, and then carries out various kinds of signal processing with the MR signals so that digitized MT data (original data) are produced.

Furthermore, the controlling/calculating part includes a sequencer 5 (also referred to as a sequence controller), host computer 6, calculator 10, storage 11, display unit 12, input device 13, and voice generator 19.

Of these constituents, the host computer 6 operates previously memorized software procedures, so that it has the functions of not only giving the sequencer 5 pulse sequence information but also managing the operations of the entire system.

The present magnetic resonance imaging system is characteristic of measuring a physical amount of a desired parameter selected from the various parameters in relation to a pulse sequence adopted by an imaging scan, prior to an imaging scan for providing MR images, and then of reflecting the measured optimum amount of the parameter into the imaging scan later conducted. Practically, the host computer 6 is configured to perform, as pictorially shown in FIG. 2, two types of scans, which consists of a preparation scan (hereinafter, referred to as a "prep. scan") and an imaging scan for acquiring echo data to be reconstructed into images. The prep. scan is executed to optimize the amount of a desired parameter chosen from a plurality of parameters incorporated in a pulse sequence performed with the imaging scan that follows the prep. scan.

The foregoing plural parameters incorporated in a pulse sequence includes:

(1) a strength of a pulse to suppress a flow void phenomenon of a fluid (such as blood flows) in an object, (2) an effective echo time $TE_{eff}$ concerning the behaviors of spins in an object, (3) a pulse to compensate spin movements due to flow of fluid, (4) an inversion time TI observed when an inversion pulse is applied to the object to cause a inversion recovery of spins, (5) an ETS (echo train spacing) given to echo signals acquired from an object, (6) a flip angle of a fat suppression pulse applied to suppress signals from being acquired from fat of an object, (7) an inversion time TI observed after applying a fat suppression pulse to the object, (8) a strength of an MT (magnetization transfer) to cause an MT effect resultant from the behaviors of spins, (9) a flip angle of a refocusing pulse to reduce an MT effect,

(10) a flip angle of an excitation RF pulse used by a pulse sequence,

(11) a flip angle of a refocusing pulse used by a pulse sequence, and

(12) a TR (repetition time) of a pulse sequence.

For imaging an object, the type of a pulse sequence is determined depending on which region and which blood flow of the object are observed and whether or not there is a difference between individual objects to be examined. Then, from various parameters inherent to the determined pulse sequence, a desired parameter is selected. The "prep. scan" is then repeatedly carried out with the amount of the selected parameter changed a plurality of times. Specifically, at the same cardiac phase for each time of RF excitation of spins, a specified region of an object is subjected to a plurality of times of data acquisition. Such specified region is the same or almost the same as that to be scanned by the imaging scan. This way of data acquisition provides image data for a plurality of frames at the same imaging region, which are then reconstructed into real-space MR images, respectively.

An operator is able to observe such MR images to specify, for example, a desired one that is the highest in image quality. This specification of a desired image results in determination of an amount of the selected parameter. That is, the determined amount is one that was given to the operator's specified image thorough the "prep. scan."

The operator then operates to enable such amount of the selected parameter to be incorporated into an imaging scan that succeeds the "prep. scan." Namely, of a variety of types of parameters of a pulse sequence employed by the imaging scan, a parameter that corresponds to the parameter subjected to variable control in the "prep. scan" is given an amount (pulse strength, pulse angle, duration, and/or others) determined with the help of the "prep. scan."

In cases where MR angiography is carried out with a contrast agent injected, a lesion and a normal region are contrasted with temporal differences therebetween. Such a period of time necessary for gaining a contrasted state should therefor be optimized. The prep. scan is extremely effective for such optimization. For example, the prep. scan can be carried out to optimize in contrast the strength of an MT (magnetization transfer) pulse between a contrasted brain parenchyma and a rain lesion.

Both the "prep. scan" and the imaging san are conducted with a breath-hold technique based on for example voice instructions.

By the way, the "prep. scan" itself is not directed to diagnostic imaging of a region to be imaged of an object, but to optimization of a desired parameter of a pulse sequence, as described above. For this reason, the matrix of images for the "prep. scan" may be coarser (i.e., rougher) than that for the imaging scan. Moreover, if the imaging scan is carried out as a three-dimensional scan, it is enough that the "prep. scan" is performed two-dimensionally, with the result that a scan time can be saved. On the other hand, it is preferred that pulse sequences employed by both the "prep. scan" and the imaging scan are the same in the type itself thereof.

Returning to FIG. 1, the sequencer 5, which has a CPU and memories, is able to store pulse sequence information that has been supplied from the host computer 6. Based on this pulse sequence information, the sequencer 5 is responsible for controlling a series of operations performed by the gradient power supply 4, transmitter 8T, and receiver 8R. In parallel with this control, the sequencer 5 temporarily receives digital data produced from MR signals that the receiver 8R has created, and then transfer those data to the calculator 10.

The pulse sequence information includes all information required for operating the gradient power supply 4, transmitter 8T, and receiver 8R according to a desired pulse sequence. Such information includes the strength, duration, and application timing of pulsed currents that should be applied to the x-, y-, and z-coil 3x to 3z.

As the pulse sequence, a two-dimensional (2D) scan or a three-dimensional (3D) scan can be adopted. Pulse trains can preferably be employed by the pulse sequence, if they are made of SSFP (Steady State Free Precession)-system sequences. Such pulse trains include pulse trains based on an SE (spin echo) technique, an FE (field gradient echo) technique, an FSE (Fast SE) technique, a FASE (Fast Asymmetric SE; also called a "half-Fourier FSE technique") technique, an EPI (echo planar imaging), and others. The FASE technique is realized based on a combination of the FSE technique and a half-Fourier technique.

The calculator 10 receives digital echo data sent from the receiver 8R via the sequencer 5, and maps those data in a Fourier space (also called the k-space or frequency space) formed by an incorporated memory. The calculator 10 also performs a two-dimensional or a three-dimensional Fourier transform on the mapped data, so that an image in the real space is reconstructed. If necessary, synthesis processing of image data can also be performed by the calculator 10. The Fourier transform may be assigned to the host computer 6, not always to the calculator 10.

The storage 11 is able to memorize, in addition to echo data and reconstructed image data, image data that have experienced a wide variety of types of processing. The display unit 12 is formed to visualize an image. The input device 13 is used to provide the host computer 6 with various types of information including the type of an operator's desired parameter, scan conditions, the type of a desired pulse sequence and its parameters, and desired one or more image processing techniques.

The voice generator 19, which composes part of the breath-hold instructing part, is configured to utter, for example, a voice message informing a patient of the start or end of a breath hold in response to a command sent from the host computer 6.

Furthermore, the electrocardiographing part comprises an ECG sensor 17 attached to the patient body to detect an electric ECG signal and an ECG unit 18 that performs various types of processing including the digitization of the detected ECG signal and sends it to both the sequencer 5 and the host computer 6. Both of the host computer 6 and the sequencer 5 use this measured ECG signal as a timing signal in performing both the "prep. scan" and the imaging scan on the basis of the ECG gating technique.

The entire operation of the above magnetic resonance imaging system will now be described.

Figure 2:
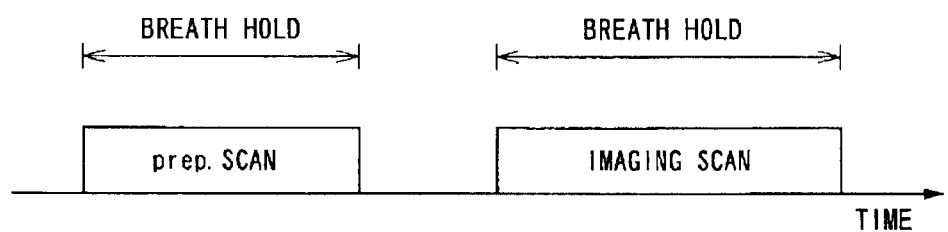
FIG. 2 illustrates a timing relationship between a "prep. scan" and an imaging scan both carried out in the embodiment.

When the imaging is started, the host computer 6 commands a "prep. scan" accompanied by a breath hold technique, prior to an imaging scan (refer to FIG. 2). The prep. scan is carried out as being described above.

Figure 3:
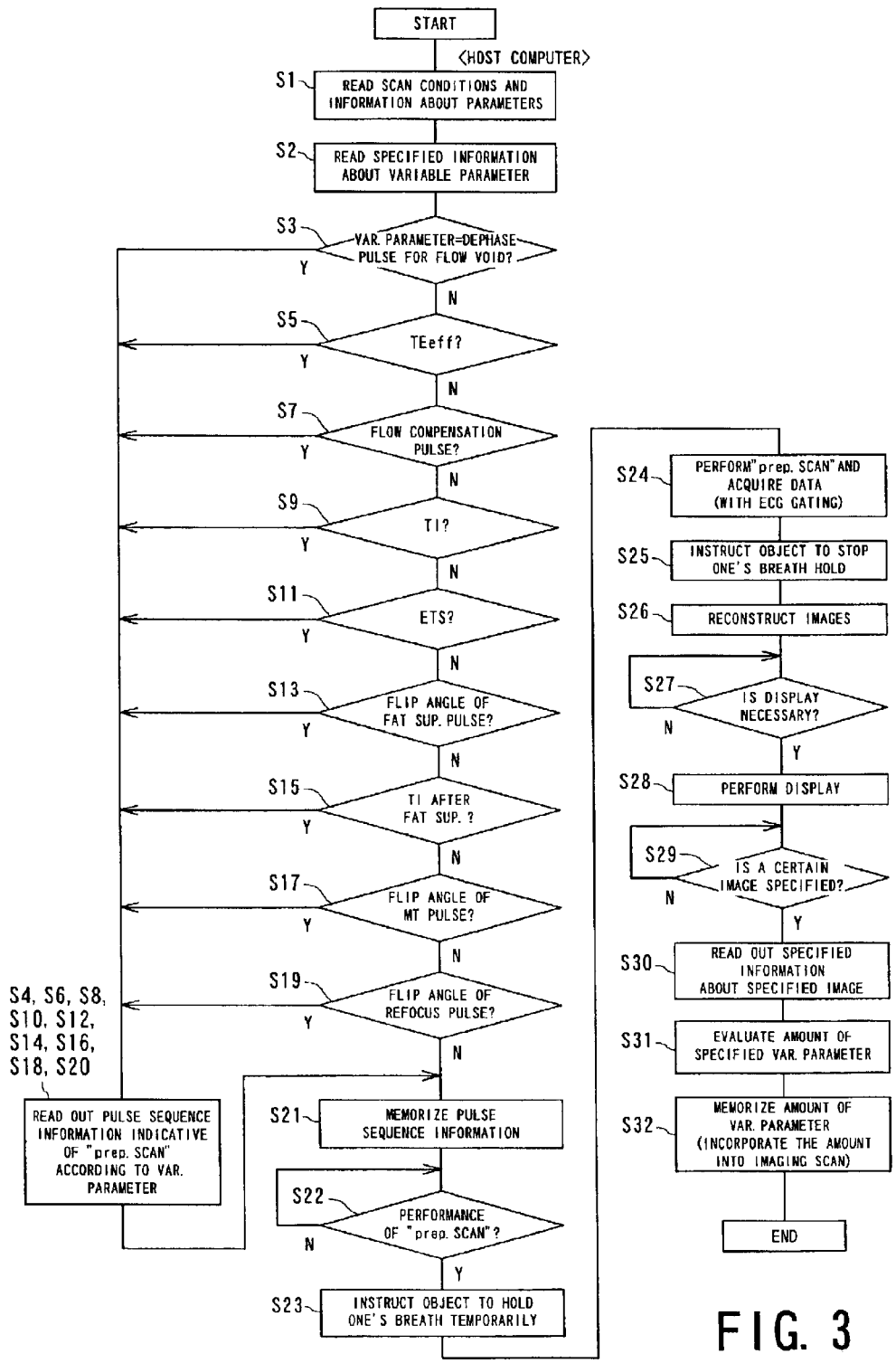
FIG. 3 is an outlined flowchart, which is conducted by a host computer, which exemplifies selection of a desired parameter from various parameters variable in the "prep. scan" and post processing for determining an optimum value of the desired parameter.

Specifically, the host computer 6 reads from the input device 13 both scan conditions and pieces of information about parameters, which are directed to the prep. scan (step S1 in FIG. 3). Such scan conditions and information about parameters are set arbitrarily by an operator with taking it into account the imaging scan that will follow the prep. scan. The scan conditions include the type of a scan, the type of a pulse sequence, and a phase-encode direction. On the other hand, the information in relation to the parameters includes a delay time from R-waves of an ECG signal for ECG gating and specified values of plural parameters in connection with the pulse sequence.

The prep. scan is carried out with the use of, preferably, a two-dimensional pulse sequence, which is able to perform scanning a desired slice of a region to be imaged of an object. A train of pulses of the pulse sequence is specified in type as pulse sequences capable of acquiring all data to be used for reconstructing an image of one slice per one time of excitation. Such pulse sequences include an FASE (i.e., half-Fourier FSE), FSE, and EPI method.

The host computer 6 reads in, from the input device 13, specified information about a variable parameter of which amount is controlled every time of data acquisition (step S2). Such variable parameter is chosen from the foregoing plural parameters. An operator specifies the information about the variable parameter in consideration of various factors, such as the type of a pulse sequence to be used and a speed of blood flow in a region to be imaged.

After this specification, the host computer 6 determines the type of the variable parameter from the read-in information, through the processing at steps S3 to S19 shown in FIG. 3.

(1. "Prep. Scan" for Flow Void Phenomenon)

First, it is determined whether or not the variable parameter is the strength of a dephase pulse in association with the flow void phenomenon (step S3). If this determination is YES, pulse sequences are set, of which dephase pulses are changed in their strength at each time of data acquisition.

Figure 4:
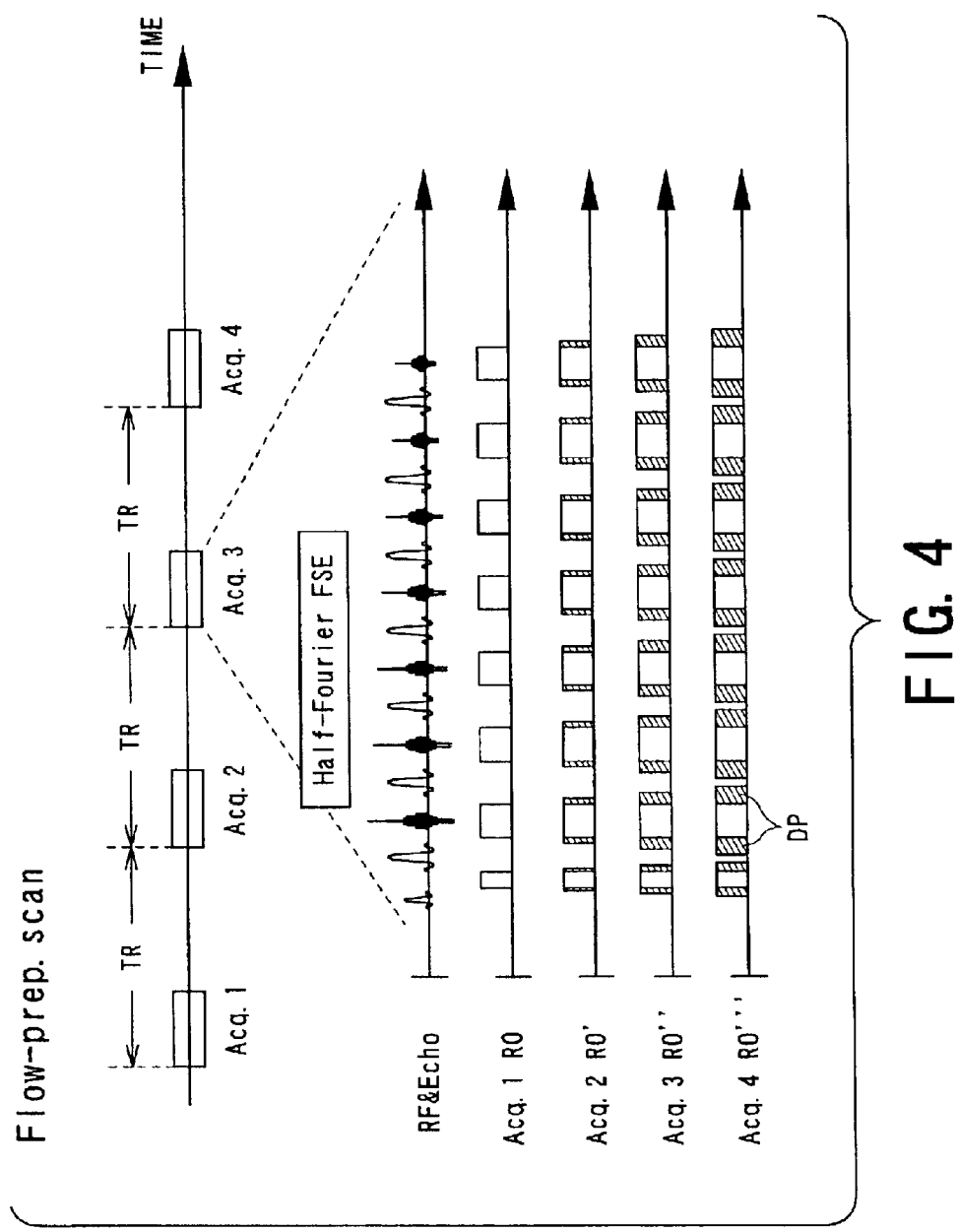
FIG. 4 is a pulse sequence that outlines an example of the "prep. scan"
Figure 5:
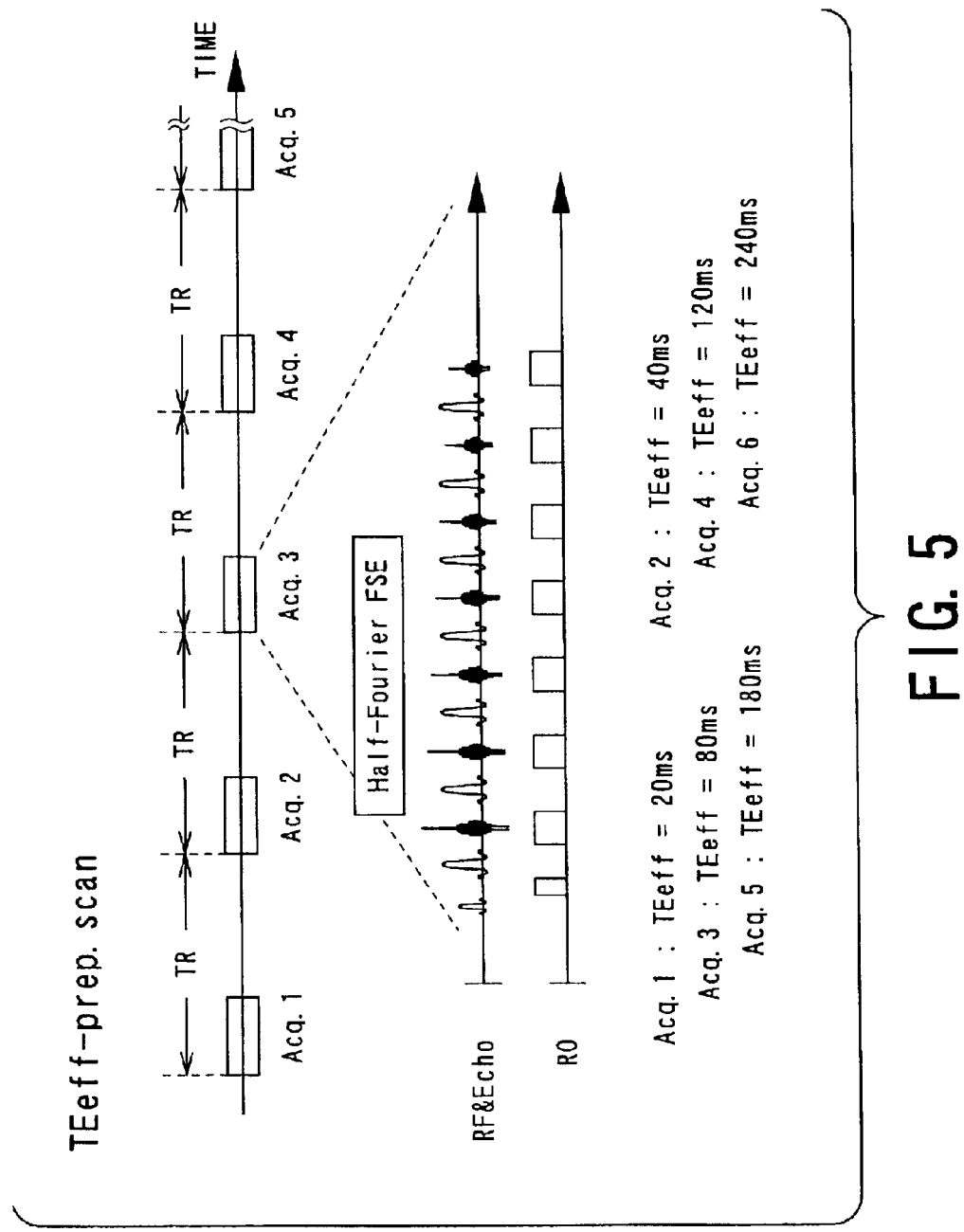
FIG. 5 is a pulse sequence that outlines another example of the "prep. scan"

FIG. 4 exemplifies the outline of such a pulse sequence. This exemplified pulse sequence is configured such that a total of four times of data acquisition (Acq. 1 to Acq. 4) is carried out with the aid of both a breath-hold technique and an ECG gating technique. A two-dimensional FASE method is used to give one time of excitation per one time of data acquisition. The ECG gating technique allows each time of data acquisition to start at the same delay time from an R-wave of the ECG signal, that is, at the same cardiac phase. The pulse sequence could be formed based on other methods, such as an EPI or FSE method, other than the FASE method. However, it is desired that the plurality of times of data acquisition accompanied by both the breath-hold and ECG-gating techniques finish within a shorter period of time, it is preferred to use pulse sequences that have the capability of allowing only one time of excitation carried out every time of data acquisition to acquire data for one slice.

In each time of data acquisition using the pulse sequence based on the FASE method, the RF excitation is carried out only one time, which generates a plurality of echoes sequentially in time. And each echo is read out together with each readout magnetic gradient pulse RO (=$G_R$) applied in the readout direction (frequency encode direction). Non-hatching pulses in FIG. 4 show such readout magnetic gradient pulses RO. Furthermore, a dephase pulse DP is attached continuously in time to the head and tail of each readout gradient pulse RO, as shown by pulses hatched in FIG. 4. As understood from FIG. 4, both the dephase pulses DP attached to each readout gradient pulse RO is controlled (changed) in their strengths every time of data acquisition.

Specifically, in the example shown in FIG. 4, the strength of both dephase pulses DP is assigned to "zero" in the first time of data acquisition Acq. 1, assigned to a "small" amount in the second time of data acquisition Acq. 2, assigned to an "intermediate" amount in the third time of data acquisition Acq. 3, and assigned to a "large" amount in the fourth time of data acquisition Acq. 4, respectively. Incidentally, in FIG. 4, the phase-encode gradient pulse is omitted from being drawn.

In this way, when the variable parameter is selected as being the dephase pulse DP, the determination at each of the steps S7, S9, S11, S13, S15, S17, S19, and S21 placed for selection of other variable parameters becomes NO. Hence the host computer 6 reads out information about the pulse sequence used in the prep. scan of which variable parameter is set to the dephase pulse DP, and sends it to the sequencer 5, before waiting for the next processing (step S21).

In cases where determining that the prep. scan is ready (step S22), the host computer 6 notifies the sequencer 5 of instructing the object (patient) P to start one's breath hold by a voice massage (step S23). Further, the ECG-gating technique is launched so as to perform the prep. scan at the same cardiac phase (that is, a single cardiac phase), with echo data acquired (step S24). After this prep. scan, another voice massage is uttered to release the breath hold that has been continued so far by the object (patient) P.

Such prep. scan enables data to be acquired in sequence on the basis of four times of RF excitation dedicated to a total of four images, as shown in FIG. 4. Each time of RF excitation produces echo data for one slice. That is, in the case of this example, the data is acquired in a single-slice and single-phase mode. Alternatively, data acquisition can be done in a multi-slice and single-phase mode, provided that the same region is always imaged.

As described above, the strength of the dephase pulses DP added to each readout gradient pulse RO is controlled every time of data acquisition, so that a dephased degree of spins is changed each time of data acquisition. In the echo data acquired in response to four times of RF excitation, various dephase degrees of spins, which are different from each other, are reflected.

On completion of the prep. scan, the host computer 6 instructs the calculator 10 to reconstruct images (step S26), and then makes the display unit 12 to visualize those reconstructed images (steps S27 and S28). In this case, the displayed images are four in number at the same slice. A total of four ways of dephase states that are caused due to the dephase pulses DP of different pulse strengths are reflected in the displayed four images.

Responsively to this display, the host commuter 6 allows an operator to manipulate the input device 13 so as to select, from the displayed four images, a single image that depicts blood flow at the highest quality in distinctiveness, then, to specify the selected image. This specified information is read by the host computer 6 (steps S29 and S30). Hence the host computer 6 detect, from the read specified information, a strength of the dephase pulses DP assigned to an image indicated by the specified information (step S31). The host computer 6 operates to set the detected strength of the dephase pulses DP as the strength of a dephase pulse used in a pulse sequence adopted by the imaging scan that will be conducted later (step S32).

Accordingly, the imaging scan is carried out under the conditions consisting of a variety of parameters and scan conditions, which are set by an operator, as well as of the strength amount of the dephase pulses DP best determined through the prep. scan. By way of example, the imaging scan is carried out with the use of a pulse sequence on a three-dimensional FASE method, in which the strength amount of the dephase pulses DP determined as above is included. This imaging scan enables of acquisition of echo data, reconstruction of images, processing of images, and display of images.

The images provided through the imaging scan are therefore provided as images obtained in the best preferable dephase state of spins in blood flow. The images are thus excellent in the depiction performance of blood flow, in which such drawbacks as reductions in signal values on account of the flow void phenomenon are removed.

In this way, the prep. scan carried out prior to the imaging scan makes it possible that an optimum flow void value in the readout direction of a region to be imaged (that is, a ratio of the dephase pulses to the readout gradient pulse) is found with steadiness and reliability. The imaging scan can be carried out depending on the found optimum flow void value.

As a modification derived from the above configuration, the signal values of data acquired by the prep. scan involving the foregoing dephase pulses of various different strengths can be used for measurement of a flow speed of blood.

(2. "Prep. Scan" for Effective Echo Time $TE_{eff}$)

Returning to FIG. 3, the selection of the remaining parameters will now be described.

In cases where the determination at step S3 becomes NO, the processing proceeds to step S5, where it is further determined whether or not the variable parameter to be changed through the prep. scan is assigned to an effective echo time $TE_{eff}$. When the determination at step S5 is YES, pulse sequences are specified as in FIG. 5, in which data acquisition is carried out responsively to each of a plurality of times of RF excitation and an effective echo time $TE_{eff}$ of the data acquisition is changed excitation by excitation (step S6). The reason for changing the effective echo time $TE_{eff}$ is to positively change contrasts to images acquired from a region to be imaged. Preferably, each pulse sequence is composed of a train of pulses based on one of a two-dimensional FASE (i.e., half-Fourier FSE), EPI, and FSE methods. By way of example, if it is supposed that echo data acquisition is carried out six times in reply to a total of six times of RF excitation included one time of prep. scan, the effective echo time $TE_{eff}$ is set as trials to 20, 40, 80, 120, 180, and 240 ms by turns each time of data acquisition.

When the performance of the pulse sequences is completed, displayed are a plurality of images whose contrasts are different from each other owning to the fact that the effective echo time $TE_{eff}$ was changed acquisition by acquisition (steps S21 to S28). It is therefore possible for an operator to observe the images as to which contrast of an image is best excellent and as to which image is desired in depiction. In response to an operator's specification of an image of a desired contrast, the host computer 6 is able to steadily give an optimum effective echo time $TE_{eff}$ to the pulse sequence in the imaging scan (steps S29 to S32). That is, the host computer 6 recognizes an effective echo time $TE_{eff}$ that has been given to the image specified by the operator, and employs the effective echo time $TE_{eff}$ as that for the pulse sequence in the imaging scan.

As a modification, the above prep. scan may be adapted to measurement of a T2 relaxation time by making the readout time of echo signals equal to each other.

(3. "Prep. Scan" for Flow Compensation)

Figure 6:
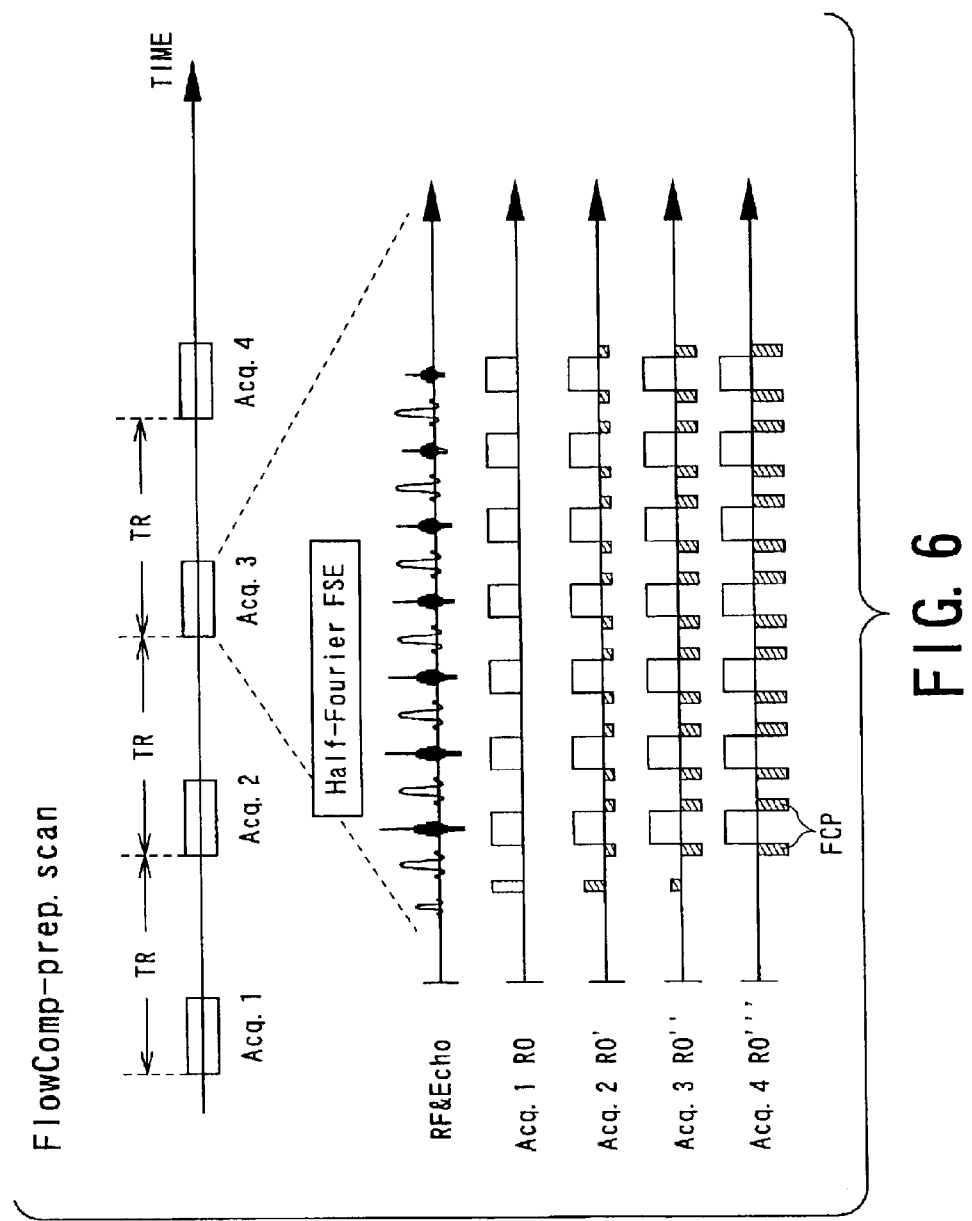
FIG. 6 is a pulse sequence that outlines another example of the "prep. scan"
Figure 7:
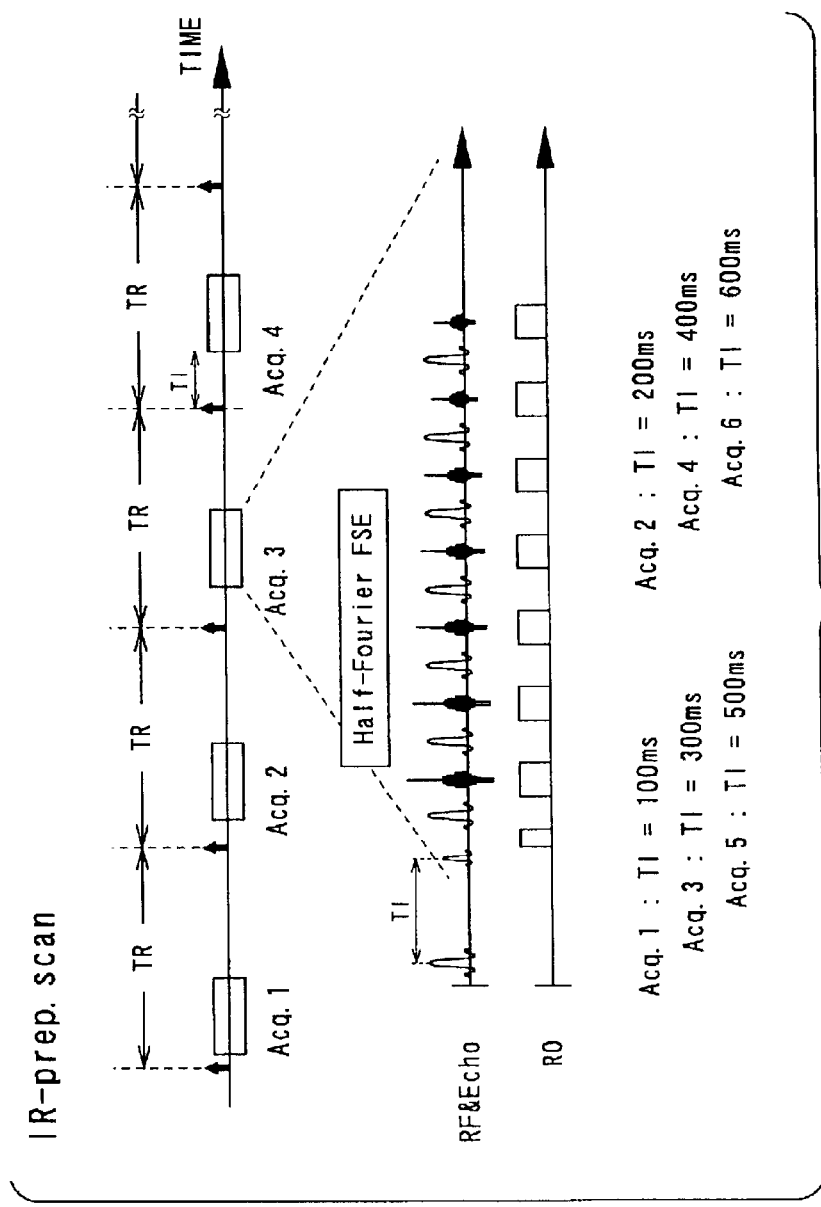
FIG. 7 is a pulse sequence that outlines another example of the "prep. scan"
Figure 8:
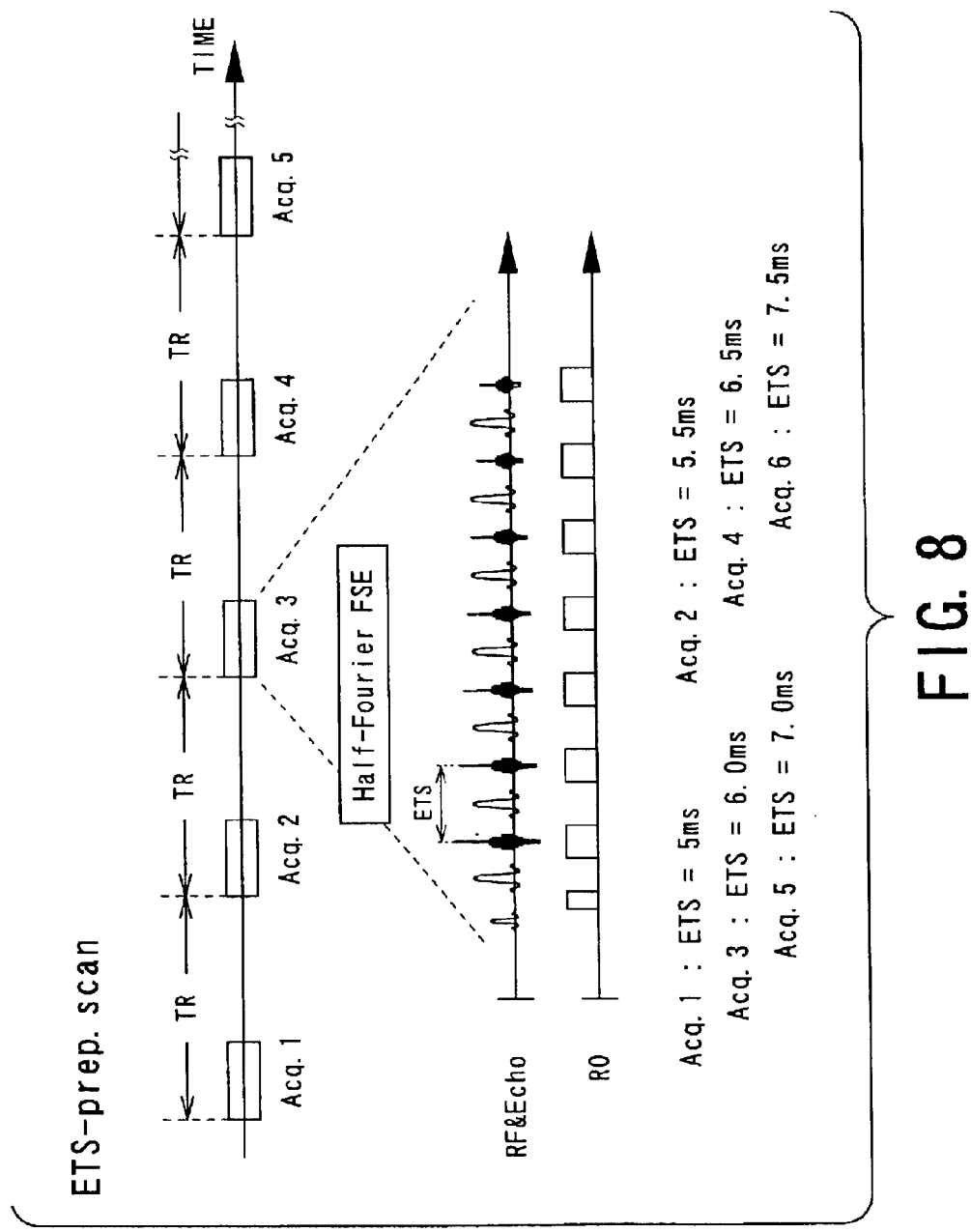
FIG. 8 is a pulse sequence that outlines another example of the "prep. scan"
Figure 9:
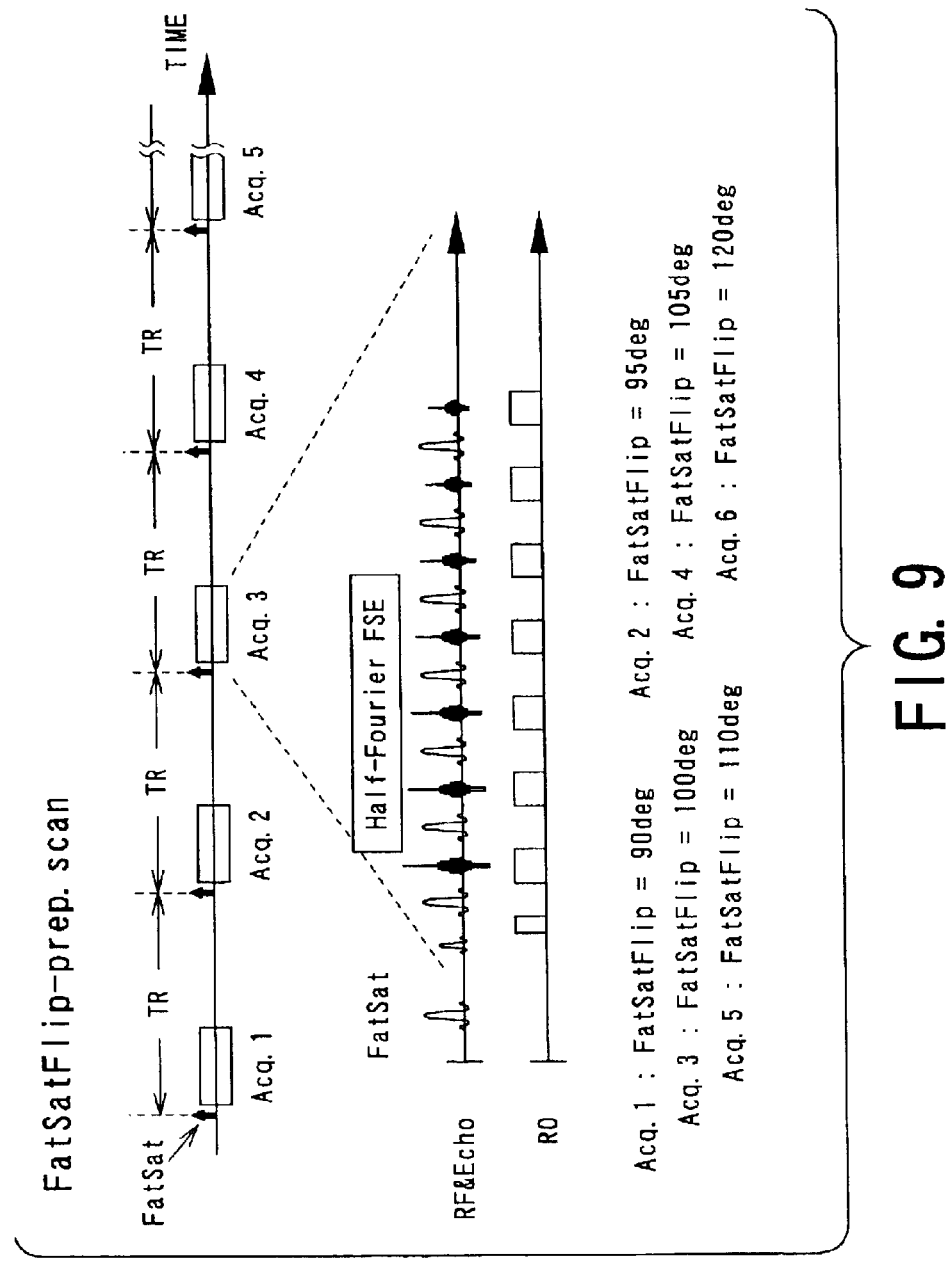
FIG. 9 is a pulse sequence that outlines another example of the "prep. scan"
Figure 10:
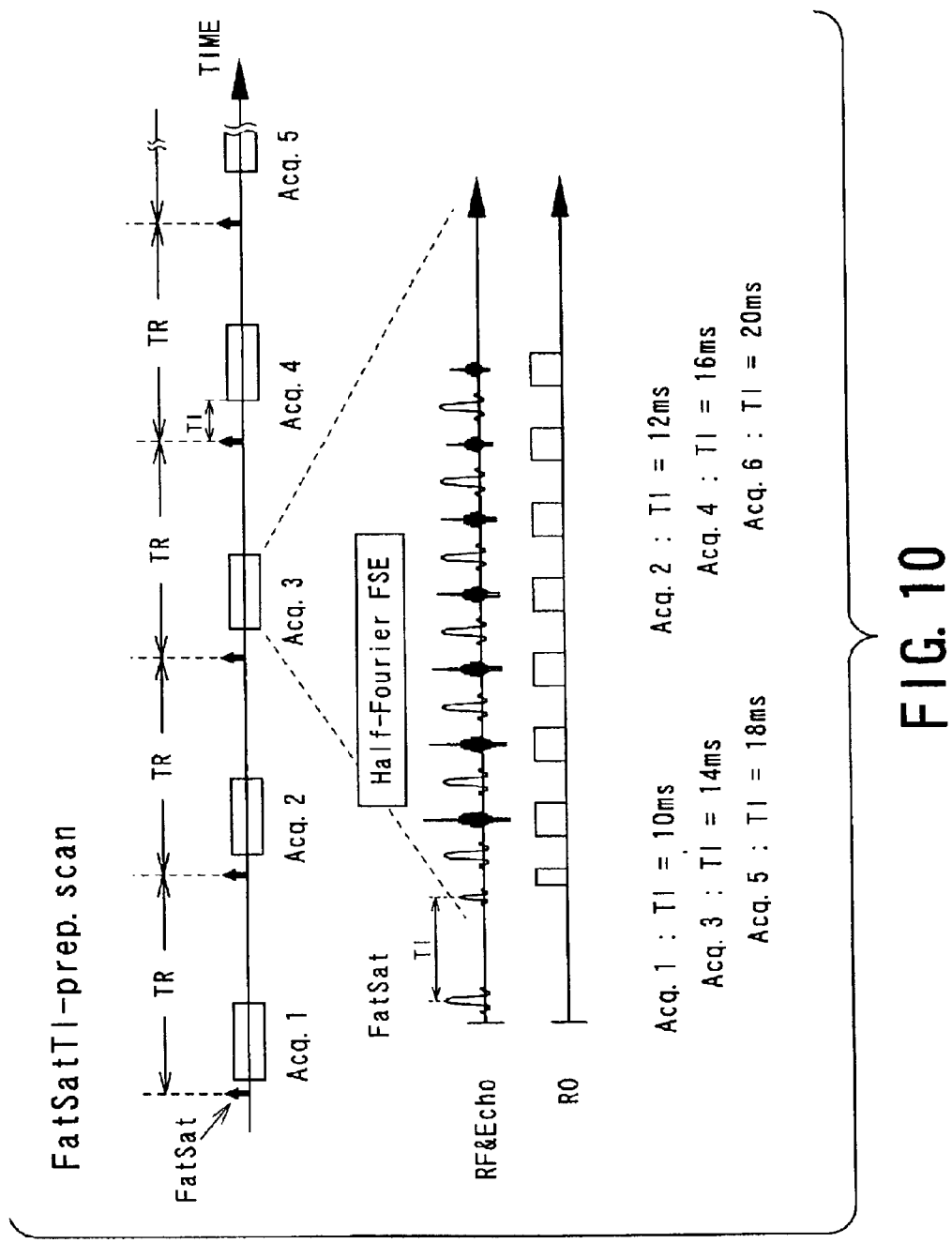
FIG. 10 is a pulse sequence that outlines another example of the "prep. scan"
Figure 11:
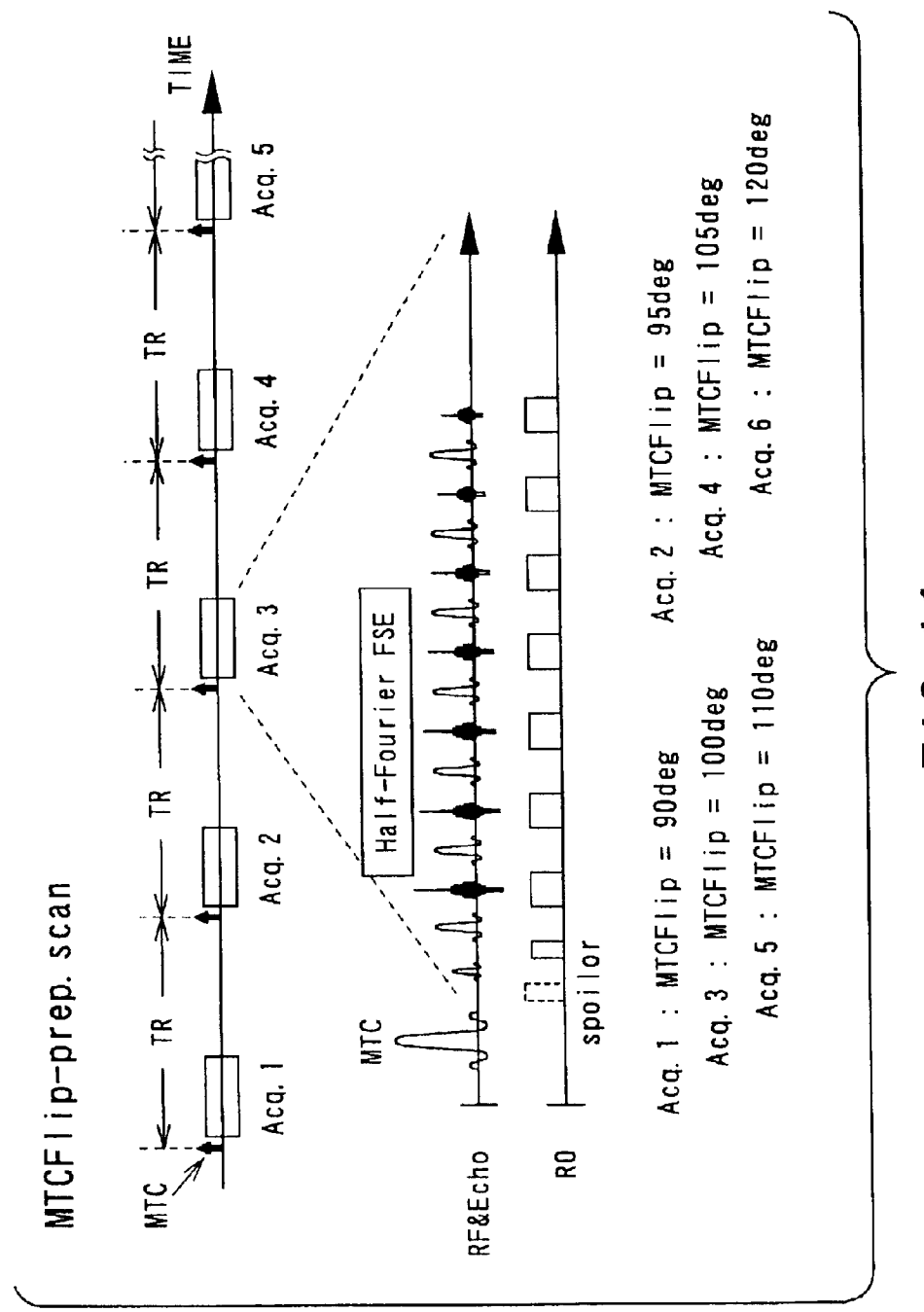
FIG. 11 is a pulse sequence that outlines another example of the "prep. scan"
Figure 12:
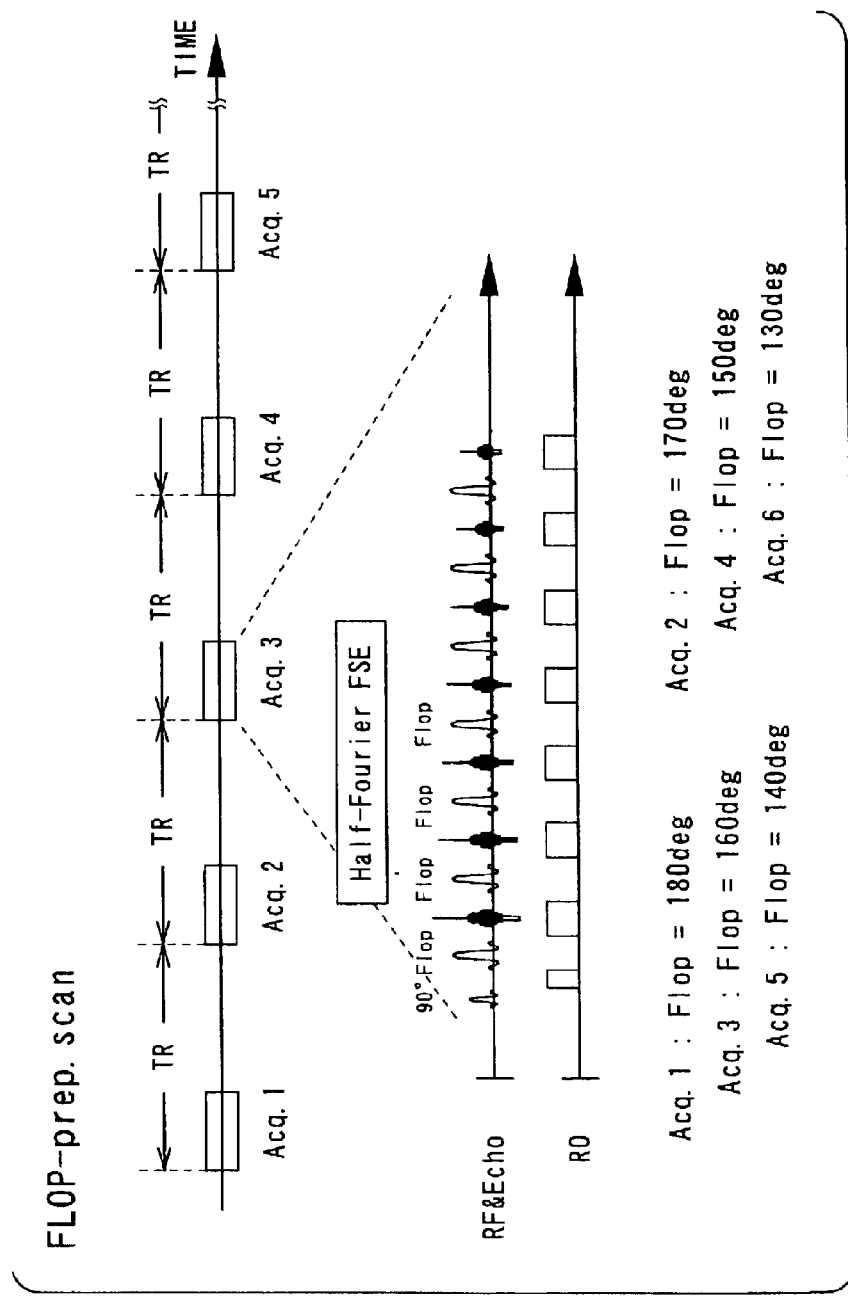
FIG. 12 is a pulse sequence that outlines another example of the "prep. scan"

In cases where the determination at step S5 in FIG. 3 becomes NO, the processing goes to step S7, where it is further determined whether or not the variable parameter to be changed through the prep. scan is assigned to a flow compensation pulse. When the determination at step S6 is YES, pulse sequences are specified as in FIG. 6, in which data acquisition is carried out responsively to each of a plurality of times of RF excitation and the strength of a flow compensation pulse FCP is changed excitation by excitation (step S8). The flow compensation pulse FCP is added to a readout gradient pulse at the head and tail (at both the temporal ends), continuously, but in reversed polarities. The flow compensation pulse is changed in its strength every time of data acquisition, in order to change, as trials, conditions of an N/2-artifact signal component that generates along a readout frequency direction in a region to be imaged. A preferred type of pulse sequence is composed of, for example, a train of pulses formed on one of a two-dimensional FASE (i.e., half-Fourier FSE), EPI, and FSE methods. FIG. 6 shows an example, where the pulse sequences each formed on the FASE method provide echo acquisition in response to a plurality of times of RF excitation contained in one time of prep. scan. The strength of the flow compensation pulse FCP is set to different amounts every time of measurement. By way of example, the pulse sequence is carried out in a single-slice and single-phase technique, but may be carried out in a multi-slice and single-phase technique.

When the performance of the pulse sequences is completed, displayed are a plurality of images whose N/2 artifacts in the readout direction are different from each other owning to the fact that the strength of the flow compensation pulse FCP was changed acquisition by acquisition (steps S21 to S28). It is therefore possible for an operator to specify, after observation and mutual comparison of the images, a desired image. In response to an operator's specification of the desired image, the host computer 6 is able to steadily give an optimum strength of the flow compensation pulse, which is owned by the specified image, to the pulse sequence in the imaging scan (steps S29 to S32).

(4. "Prep. Scan" for Inversion Time TI)

In cases where the determination at step S7 in FIG. 3 becomes NO, the processing proceeds to step S9, where it is further determined whether or not the variable parameter to be changed through the prep. scan is assigned to an inversion time TI. When the determination at step S9 is YES, pulse sequences are specified as in FIG. 7, in which data acquisition is carried out responsively to each of a plurality of times of RF excitation and an inversion time TI for the data acquisition is changed excitation by excitation (step S10). The reason for changing the inversion time TI is to positively change contrasts to images acquired from a region to be imaged. Preferably, each pulse sequence is composed of a train of pulses based on one of a two-dimensional FASE, EPI, and FSE methods each involving an inversion recovery (IR) method. By way of example, if it is supposed that echo data acquisition is carried out six times in reply to a total of six times of RF excitation included one time of prep. scan, the inversion recovery time TI is set as trials to 100, 200, 300, 400, 500, and 600 ms by turns each time of data acquisition.

When the performance of the pulse sequences is completed, displayed are a plurality of images whose contrasts are different from each other owning to the fact that the period of the inversion time TI was changed acquisition by acquisition (steps S21 to S28). It is therefore possible for an operator to specify, after observation and mutual comparison of the images, a desired image from a desired contrast viewpoint. In response to an operator's specification of the desired image, the host computer 6 is able to steadily give an optimum inversion time TI, which is owned by the specified image, to the pulse sequence in the imaging scan (steps S29 to S32).

The "prep. scan" for optimizing the inversion time TI is practically useful for imaging the whole heart two-dimensionally or three-dimensionally. Circulation speeds of blood flow differ person by person, thereby affecting not only locations of a normal myocardial muscle and a myocardial infarction but also the longitudinal relaxation time T1. This will appear as changes in the inversion time, which is a period of time required for the longitudinal magnetization Mz to reach the null point. Hence the "prep. scan" for optimizing the inversion time TI can be executed, prior to the imaging scan, to find an optimum inversion time TI that allows a normal myocardial muscle, a myocardial infarction, and blood flow to be depicted optimally. If using this optimum inversion time TI in the imaging scan, the entire heart can be imaged two- or three-dimensionally at highly improved contrast rates among the normal myocardial muscle, myocardial infarction, and blood flow.

As a modification, the above prep. scan may be adapted to measurement of a T1 relaxation time by making the readout time of echo signals equal to each other.

(5. "Prep. Scan" for Echo Train Spacing ETS)

In cases where the determination at step S9 in FIG. 3 becomes NO, the processing proceeds to step S11, where it is further determined whether or not the variable parameter to be changed through the prep. scan is assigned to an echo train spacing ETS. When the determination at step S11 is YES, pulse sequences are specified as in FIG. 8, in which data acquisition is carried out responsively to each of a plurality of times of RF excitation and an echo train spacing ETS (a period of time) of the data acquisition is changed excitation by excitation (step S12). The reason for changing the echo train spacing ETS is to positively change contrasts given to images or blurring in the phase encode direction of the images. Preferably, each pulse sequence is composed of a train of pulses based on one of a two-dimensional FASE, EPI, and FSE methods each involving an inversion recovery (IR) method. By way of example, if it is supposed that echo data acquisition is carried out six times in reply to a total of six times of RF excitation included one time of prep. scan, the echo train spacing ETS is set as trials to 5, 5.5, 6, 6.5, 7, and 7.5 ms by turns each time of data acquisition.

When the performance of the pulse sequences is completed, displayed are a plurality of images whose contrasts or blurring degrees in the phase encode direction are different from each other owning to the fact that the echo train spacing was changed acquisition by acquisition (steps S21 to S28). It is therefore possible for an operator to specify, after observation and mutual comparison of the images, a desired image from a desired contrast or blurring viewpoint. In response to an operator's specification of the desired image, the host computer 6 is able to steadily give an optimum echo train spacing ETS, which is owned by the specified image, to the pulse sequence in the imaging scan (steps S29 to S32).

As a modification, the above prep. scan may be adapted to measurement of a T2 relaxation time by making the readout time of echo signals equal to each other.

(6. "Prep. Scan" for Flip Angle of Fat Suppression Pulse)

In cases where the determination at step S11 in FIG. 3 becomes NO, the processing proceeds to step S13, where it is further determined whether or not the variable parameter to be changed through the prep. scan is assigned to the flip angle of a fat suppression pulse FatSat. When the determination at step S13 is YES, pulse sequences are specified as in FIG. 9, in which data acquisition is carried out responsively to each of a plurality of times of RF excitation and the flip angle of the fat suppression pulse FatSat used for the data acquisition is changed excitation by excitation (step S14). The reason for changing the flip angle of the fat suppression pulse FatSat is to positively change fat-suppression-specific contrasts given to images acquired from a region to be imaged. Preferably, each pulse sequence is composed of a train of pulses based on one of a two-dimensional FASE, EPI, and FSE methods each involving an inversion recovery (IR) method. By way of example, if it is supposed that echo data acquisition is carried out six times in reply to a total of six times of RF excitation included one time of prep. scan, the flip angle is set as trials to 90, 95, 100, 105, 110, and 120 degrees by turns each time of data acquisition.

When the performance of the pulse sequences is completed, displayed are a plurality of images whose fat contrasts are different from each other owning to the fact that the flip angle of the fat suppression pulse FatSat was changed acquisition by acquisition (steps S21 to S28). It is therefore possible for an operator to specify, after observation and mutual comparison of the images, a desired image from a desired fat-contrast viewpoint. In response to an operator's specification of the desired image, the host computer 6 is able to steadily give an optimum flip angle of the fat suppression pulse FatSat, which is owned by the specified image, to the pulse sequence in the imaging scan (steps S29 to S32).

(7. "Prep. Scan" for Inversion Recovery Performed After Sat Suppression)

In cases where the determination at step S13 in FIG. 3 becomes NO, the processing proceeds to step S15, where it is further determined whether or not the variable parameter to be changed through the prep. scan is assigned to an inversion time TI after application of a fat suppression pulse FatSat. When the determination at step S15 is YES, pulse sequences are specified as in FIG. 10, in which data acquisition is carried out responsively to each of a plurality of times of RF excitation and the inversion time TI after the fat suppression pulse FatSat is changed excitation by excitation (step S16). The reason for changing the inversion time applied after the fat suppression pulse FatSat is to positively change fat-suppression-specific contrasts given to images acquired from a region to be imaged. Preferably, each pulse sequence is composed of a train of pulses based on one of a two-dimensional FASE, EPI, and FSE methods. By way of example, if it is supposed that echo data acquisition is carried out six times in reply to a total of six times of RF excitation included one time of prep. scan, the inversion time TI applied after the fat suppression pulse FatSat is set as trials to 10, 12, 14, 16, 18, and 20 ms by turns each time of data acquisition.

When the performance of the pulse sequences is completed, displayed are a plurality of images whose contrasts are different from each other owning to the fact that the inversion time was changed acquisition by acquisition (steps S21 to S28). It is therefore possible for an operator to specify, after observation and mutual comparison of the images, a desired image from a desired contrast viewpoint. In response to an operator's specification of the desired image, the host computer 6 is able to steadily give an optimum inversion time TI applied after the fat suppression pulse FatSat, which is owned by the specified image, to the pulse sequence in the imaging scan (steps S29 to S32).

(8. "Prep. Scan for Flip Angle of MT Pulse)

In cases where the determination at step S15 in FIG. 3 becomes NO, the processing proceeds to step S17, where it is further determined whether or not the variable parameter to be changed through the prep. scan is assigned to the flip angle of an MT (magnetization transfer) pulse (also called an "MTC" pulse). When the determination at step S17 is YES, pulse sequences are specified as in FIG. 11, in which data acquisition is carried out responsively to each of a plurality of times of RF excitation and the flip angle (i.e., the intensify) of the MT pulse is changed excitation by excitation (step S18). The reason for changing the flip angle of the MT pulse is to positively change MT-effects-specific contrasts given to images acquired from a region to be imaged. Preferably, each pulse sequence is composed of a train of pulses based on one of a two-dimensional FASE, EPI, and FSE methods. By way of example, if it is supposed that echo data acquisition is carried out six times in reply to a total of six times of RF excitation included one time of prep. scan, the flip angle MTCFlip of the MT pulse is set as trials to 90, 95, 100, 105, 110, and 120 degrees by turns each time of data acquisition.

When the performance of the pulse sequences is completed, displayed are a plurality of images whose contrasts are different from each other owning to the fact that the flip angle of the MT pulse was changed acquisition by acquisition (steps S21 to S28). It is therefore possible for an operator to specify, after observation and mutual comparison of the images, a desired image from a desired contrast viewpoint. In response to an operator's specification of the desired image, the host computer 6 is able to steadily give an optimum flip angle, which is owned by the specified image, to the MT pulse to be incorporated in the pulse sequence for the imaging scan (steps S29 to S32).

(9. "Prep. Scan" for Flip Angle of Refocusing Pulse)

In cases where the determination at step S17 in FIG. 3 becomes NO, the processing proceeds to step S19, where it is further determined whether or not the variable parameter to be changed through the prep. scan is assigned to the flip angle of a refocusing pulse. When the determination at step S19 is YES, pulse sequences are specified as in FIG. 12, in which data acquisition is carried out responsively to each of a plurality of times of RF excitation and the flip angle (i.e., the intensify) of the refocusing pulse is changed excitation by excitation (step S20). The reason for changing the flip angle of the refocusing pulse is to positively change contrasts given to images acquired from a region to be imaged. Preferably, each pulse sequence is composed of a train of pulses based on one of a two-dimensional FASE, EPI, and FSE methods. By way of example, if it is supposed that echo data acquisition is carried out six times in reply to a total of six times of RF excitation included one time of prep. scan, the flip angle Flop of the refocusing pulse is set as trials to 180, 170, 160, 150, 140, and 130 degrees by turns each time of data acquisition.

When the performance of the pulse sequences is completed, displayed are a plurality of images whose contrasts are different from each other owning to the fact that the flip angle of the refocusing pulse was changed acquisition by acquisition (steps S21 to S28). It is therefore possible for an operator to specify, after observation and mutual comparison of the images, a desired image from a desired contrast viewpoint. In response to an operator's specification of the desired image, the host computer 6 is able to steadily give an optimum flip angle, which is owned by the specified image, to the refocusing pulse to be incorporated in the pulse sequence for the imaging scan (steps S29 to S32).

As described so far, the magnetic resonance imaging system according to the various embodiments employs the technique of performing a "prep. scan (preparation scan" to determine an optimum amount of desired one chosen from the parameters of an imaging scan. Echo data into which changed amounts of the desired parameter are reflected are acquired by the prep. scan, and images produced from the acquired echo data provide an operator with an optimum amount of the desired parameter in the actual imaging scan. This way enables the contrast or non-contrast MR angiography to provide images with excellent contrast, less noise, and higher depiction of blood flow.

Additionally, there is almost no need for performing re-imaging for reasons of poor depictions of images or the like. Thus, a scan time needed for a patient can be shortened as a whole, with operational loads on operators reduced remarkably. A patient throughput will be improved.

In the foregoing embodiment, the preparation scan performing means (or unit) of the present invention is composed of the magnet 1, power supplies 2 and 4, coil unit 3, sequencer 5, host computer 6, RF coil, receiver 8R, and transmitter 8T. The preparatory image producing means (or unit) of the present invention is functionally formed by, as one example, the sequencer 6, calculator 10, and storage 11. The displaying means (or unit) of the present invention is functionally configured by the host computer 5 and display unit 12. The selection means (or unit) of the present invention is functionally formed by the host computer 6 and input device 13, while the setting means of the present invention is realized by part of the functions of host computer 6. The breath-hold instructing means (or unit) is functionally formed by the host computer 6 and the voice generator 19.

The foregoing configurations of the magnetic resonance imaging system can be modified many ways as follows.

Figure 13:
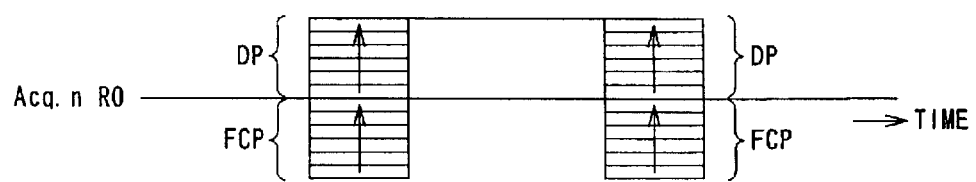
FIG. 13 is a pulse sequence that outlines another example of the "prep. scan."

In the foregoing embodiments, the variable parameter of which amount is changed during the prep. scan has always one type, but it is not a definitive list. One example for plural variable parameters is shown in FIG. 13, where both of a dephasing pulse DP for flow void and a flow compensation pulse FCP are selected at a time, and the amounts of both parameters are changed every excitation in the prep. scan, like the foregoing ones. Hence a plurality of images to each of the two parameters are obtained responsively to plural times of RF excitation, even through one time of prep. scan. In other words, preparation images for both of flow void and flow compensation are acquired at a time. This way of setting plural parameters will lead to a saved acquisition time of echo data in the prep. scan, while still giving mutually-independent optimum amounts to both the pulses at a time.

The parameters, of which amounts are optimized thorough the prep. scan, may include a flip angle of an RF pulse (such as an excitation RF pulse) used by a pulse sequence, a flip angle of a refocusing pulse used by a pulse sequence, and a TR (repetition time) of a pulse sequence. It is therefore possible, for example, to reduce the RF power by optimizing the flip angle of the excitation RF pulse.

Further, in the pulse train shown in FIG. 13, changing the amounts of the variable parameter is started from application of the flow compensation pulse FCP. Alternatively, the application of the dephasing pulse DP may be subjected to changing its amounts prior to that of the flow compensation pulse FCP (in such as case, the arrows are shown downward in FIG. 13).

The foregoing embodiment and its modifications have been directed to the MR angiography (MRA) carried out with or without an MR contrast agent, but not limited to such MRA. The present invention can be applied to MR imaging carried out without the MR contrast agent.

Although the embodiments described above contain many specificities, these should not be construed as limiting the scope of the present invention but as mealy providing illustrations of some of the presently preferred embodiments of the present invention. The person skilled in the art can alter or modify the present invention into a variety of different modes without departing from the scope of the appended claims and their equivalents. By way of example, the system described in the foregoing embodiment and its modifications have been directed to the non-contrast MR angiography (i.e., MR angiography carried out without injecting an MR contrast agent), but this is not a definitive list. An object to be imaged is not confined to blood flow, but any other objects, such as, a tissue that exist in a fiber form, can be imaged based on the principle of the present invention.

What is claimed is:

1. A magnetic resonance imaging system for performing an imaging scan based on a selected pulse sequence to obtain an MR image at a selected region of an object to be imaged, the system comprising:

a preparation scan performing unit configured to perform a preparation scan to acquire data for a plurality of preparatory images all at the same common location in the selected region of the object, the preparation scan being performed with the value of at least one desired image quality parameter of the pulse sequence being changed for acquisition of each of plural preparatory images;

a preparatory image producing unit configured to produce a corresponding plurality of preparatory images having differing image quality parameters from the data acquired by the performance of the preparation scan;

a displaying unit configured to display the plurality of preparatory images associated with respectively different image quality parameters;

a selection unit configured to allow a desired preparatory image to be selected from the plurality of preparatory images displayed by the displaying unit; and a setting unit configured to set, into an imaging scan, the value of the image quality parameter associated with the selected preparatory image.

2. A magnetic resonance imaging system as in claim 1, wherein the preparation scan performing unit is configured to perform the preparatory scan with an image matrix smaller in size than that performed by the imaging scan.

3. A magnetic resonance imaging system as in claim 1, wherein the preparation scan is a two-dimensional scan and the imaging scan is a three-dimensional scan.

4. A magnetic resonance imaging system as in claim 1, wherein the preparation scan performing unit is configured to perform the preparation scan prior to the performance of the imaging scan.

5. A magnetic resonance imaging system as in claim 1, further comprising a breath-hold instructing unit configured to instruct the object to continue holding its breath during preparation scan and during the imaging scan.

6. A magnetic resonance imaging system as in claim 1, wherein the pulse sequence includes a train of pulses belonging to SSFP (Steady State Free Precession)-system pulse sequences.

7. A magnetic resonance imaging system as in claim 1, wherein the at least one desired image quality parameter of the pulse sequence includes at least one parameter selected from the group of image contrast parameters consisting of:

a strength of a pulse to suppress a flow void phenomenon of a fluid in the object;

an effective echo time $TE_{eff}$ concerning behaviors of spins of the object;

a pulse to compensate spin movements due to flow of fluid in the object;

a TI (inversion time) of spins observed when an inversion pulse is applied to the object;

an ETS (echo train spacing) time given to echo signals acquired from the object;

a flip angle of a fat suppression pulse applied to suppress signals from being acquired from fat of the object;

a TI (inversion time) time observed when a fat suppression pulse is applied to the object;

a strength of an MT (magnetization transfer) to cause an MT effect resultant from behaviors of spins in the object;

an angle of a refocusing pulse to reduce an MT effect to be caused in the object;

a flip angle of an RF pulse incorporated in the pulse sequence;

a flip angle of a refocusing pulse incorporated in the pulse sequence; and a TR (repetition time) of the pulse sequence.

8. A magnetic resonance imaging system for performing an imaging scan based on a selected pulse sequence in order to obtain an MR image at a selected region of an object to be imaged, the system comprising:

a preparation scan performing unit configured to perform a preparation scan to acquire data for a plurality of preparatory images all at a common slice located in the selected region of the object, the preparation scan being performed with a TI (inversion time) incorporated in the pulse sequence being changed for acquisition of each of plural preparatory images, the TI being observed when an inversion pulse is applied to the selected region of the object;

a preparatory image producing unit configured to produce a corresponding plurality of preparatory images from the data acquired by the performance of the preparation scan;

a displaying unit configured to display the plurality of preparatory images;

a selection unit configured to allow a desired preparatory image to be selected from the plurality of preparatory images displayed by the displaying unit; and a setting unit configured to set, into an imaging scan, the TI period associated with the selected preparatory image.

9. A magnetic resonance imaging system for performing a three-dimensional imaging scan based on a selected pulse sequence in order to obtain an MR image at a selected region of an object to be imaged, the system comprising:

a preparation scan performing unit configured to perform a two-dimensional preparation scan to acquire data for a plurality of preparatory images at a common slice located in the selected region of the object, the preparation scan being performed with the value of at least one desired image contrast parameter of the pulse sequence being changed for acquisition of each of plural preparatory images;

a preparatory image producing unit configured to produce a corresponding plurality of preparatory images having different contrast parameters from the data acquired by the performance of the preparation scan; and a setting unit configured to set the value of the at least one desired contrast parameter for the imaging scan on the basis of the plurality of preparatory images produced.

10. A method of optimizing at least one image quality parameter of an MR imaging scan pulse sequence, the imaging scan being performed to provide an MR image at a selected region of an object to be imaged, the method comprising:

performing a preparation scan to acquire data for a plurality of preparatory images at a common slice located in the selected region of the object, the preparation scan being performed with the value of at least one desired image quality parameter of the pulse sequence being changed for acquisition of each of plural preparatory images;

producing a corresponding plurality of preparatory images having differing image plurality parameters from the data acquired by the performance of the preparation scan;

displaying the plurality of preparatory images;

selecting a desired preparatory image from the plurality of preparatory images displayed; and setting, into the imaging scan, the value of the at least one desired image quality parameter associated with the selected preparatory image.

11. A method of optimizing at least one image quality parameter of an MR imaging scan pulse sequence, the imaging scan being performed to provide an MR image at a selected region of an object to be imaged, the method comprising:

performing a two-dimensional preparation scan to acquire data for a plurality of preparatory images at a common slice located in the selected region of the object, the preparation scan being performed with the value of at least one desired image quality parameter of the pulse sequence being changed for acquisition of each of plural preparatory images;

producing a corresponding plurality of preparatory images having differing image quality parameters from the data acquired by the performance of the preparation scan; and setting the value of the at least one desired image quality parameter of the imaging scan on the basis of the plurality of preparatory images produced.

12. A magnetic resonance imaging system for performing a three-dimensional imaging scan based on a selected pulse sequence to obtain an MR image at a selected region of an object, said object being placed in a magnetic static field, to which magnetic gradient fields are applied and from which an MR echo is detected, the system comprising:

a sequencer configured to operate in response to information about the pulse sequence so as to cause not only the magnetic gradient fields and the RF signal to be applied to the region of the object but also the echo to be received;

first means operated through the sequencer by a host computer and configured to perform a two-dimensional preparation scan to acquire data for a plurality of preparatory images at a common slice located in the selected region of the object, the preparation scan being performed with the value of at least one desired image contrast parameter of the pulse sequence being changed for acquisition of each of plural preparatory images and being performed with an image matrix smaller in size than that performed by the imaging scan;

a calculator configured to produce a corresponding plurality of preparatory images having differing image contrast parameters from the data acquired by the performance of the preparation scan;

a display unit configured to display the plurality of preparatory images;

an input device configured to allow a desired preparatory image to be selected from the plurality of preparatory images displayed by the display unit; and second means operated by the host computer and configured to set, into an imaging scan, the value of the at least one desired image contrast parameter associated with the selected preparatory image.

13. A magnetic resonance imaging system as in claim 12, wherein the preparation scan performing unit is configured to perform the preparation scan prior to the performance of the imaging scan.

14. A magnetic resonance imaging system as in claim 13, further comprising a breath-hold instructing unit configured to instruct the object to continue holding its breath during the preparation scan and during the imaging scan.

15. A magnetic resonance imaging system as in claim 14, wherein the pulse sequence includes a train of pulses belonging to SSFP (Steady State Free Precession)-system pulse sequences.

16. A magnetic resonance imaging system as in claim 15, wherein the at least one desired image contrast parameter of the pulse sequence includes at least one parameter selected from a group of parameters consisting of:

a strength of a pulse to suppress a flow void phenomenon of a fluid in the object;

an effective echo time $TE_{eff}$ concerning behaviors of spins of the object;

a pulse to compensate spin movements due to flow of fluid in the object;

a TI (inversion time) of spins observed when an inversion pulse is applied to the object;

an ETS (echo train spacing) time given to echo signals acquired from the object;

a flip angle of a fat suppression pulse applied to suppress signals from being acquired from fat of the object;

a TI (inversion time) observed when a fat suppression pulse is applied to the object;

a strength of an MT (magnetization transfer) to cause an MT effect resultant from behaviors of spins in the object;

an angle of a refocusing pulse to reduce an MT effect to be caused in the object;

a flip angle of an RE pulse incorporated in the pulse sequence;

a flip angle of a refocusing pulse incorporated in the pulse sequence; and a TR (repetition time) of the pulse sequence.

* * * * *